(12) United States Patent
Ning et al.

(10) Patent No.: US 11,515,315 B2
(45) Date of Patent: Nov. 29, 2022

(54) SINGLE-LAYER POLYSILICON NONVOLATILE MEMORY CELL AND MEMORY INCLUDING THE SAME

(71) Applicant: Chengdu Analog Circuit Technology Inc., Chengdu (CN)

(72) Inventors: Dan Ning, Chengdu (CN); Zhongbo He, Chengdu (CN); Tengfeng Wang, Chengdu (CN)

(73) Assignee: Chengdu Analog Circuit Technology Inc., Chengdu (CN)

( * ) Notice: Subject to any disclaimer, the term of this patent is extended or adjusted under 35 U.S.C. 154(b) by 0 days.

(21) Appl. No.: 17/087,429

(22) Filed: Nov. 2, 2020

(65) Prior Publication Data

US 2021/0134817 A1   May 6, 2021

(30) Foreign Application Priority Data

Nov. 6, 2019  (CN) .......................... 201911077565.9
Oct. 12, 2020 (CN) .......................... 202011083173.6

(51) Int. Cl.

| | |
|---|---|
| *G11C 16/04* | (2006.01) |
| *H01L 27/11524* | (2017.01) |
| *H01L 27/1156* | (2017.01) |
| *G11C 17/14* | (2006.01) |
| *G11C 16/24* | (2006.01) |
| *G11C 16/08* | (2006.01) |
| *G11C 16/10* | (2006.01) |

(52) U.S. Cl.
CPC .... *H01L 27/11524* (2013.01); *G11C 16/0483* (2013.01); *G11C 16/08* (2013.01); *G11C 16/10* (2013.01); *G11C 16/24* (2013.01); *G11C 17/14* (2013.01); *H01L 27/1156* (2013.01)

(58) Field of Classification Search
CPC .......... H01L 27/11524; H01L 27/1156; H01L 27/11558; G11C 16/0483; G11C 16/08; G11C 16/10; G11C 16/24; G11C 17/14; G11C 16/0433; G11C 16/26; G11C 16/0441
USPC .................................................... 365/185.18
See application file for complete search history.

(56) References Cited

U.S. PATENT DOCUMENTS

| | | | |
|---|---|---|---|
| 5,684,434 A | 11/1997 | Mann et al. | |
| 5,877,656 A | 3/1999 | Mann et al. | |
| 6,081,451 A * | 6/2000 | Kalnitsky ............ | G11C 16/26 365/185.12 |

(Continued)

*Primary Examiner* — Tha-O H Bui
(74) *Attorney, Agent, or Firm* — Andrew D. Fortney; Central California IP Group, P.C.

(57) ABSTRACT

The present invention relates to a single-layer polysilicon nonvolatile memory cell, a group structure thereof and a memory including the same. The memory cell includes a selection transistor and a storage transistor, wherein the selection transistor is connected in series with the storage transistor; and the selection transistor and the storage transistor are arranged on a substrate in a mutually perpendicular manner. A memory cell group includes four memory cells, arranged in a center-symmetrical array of two rows×two columns. The memory comprises at least one memory cell group. The memory cell and the memory thereof are used as a one-time programming memory cell and memory, and have the advantages of small area, high programming efficiency and capability, and strong data retention capability.

20 Claims, 11 Drawing Sheets

(56) References Cited

U.S. PATENT DOCUMENTS

| | | | | |
|---|---|---|---|---|
| 6,157,574 | A | * | 12/2000 | Kalnitsky ............ G11C 11/5621 365/185.26 |
| 6,920,067 | B2 | * | 7/2005 | Hsu ....................... H01L 27/118 365/185.26 |
| 7,352,632 | B2 | * | 4/2008 | Shirota .............. G11C 16/0433 365/185.26 |
| 2005/0030827 | A1 | * | 2/2005 | Gilliland ............ G11C 16/3468 365/232 |
| 2008/0048240 | A1 | | 2/2008 | Kamath et al. |
| 2009/0003074 | A1 | * | 1/2009 | Georgescu ........ H01L 27/11521 257/E27.103 |

\* cited by examiner

FIG. 6

| | Unit | BL | WL | COM | N-well |
|---|---|---|---|---|---|
| Programmable unit 400 | 400 | Vpp | 0 | 0 | Vpp |
| | 401 | Vpp | Vpp | 0 | Vpp |
| | 402 | 0 | 0 | 0 | Vpp |
| | 403 | 0 | Vpp | 0 | Vpp |
| Reading unit 400 | 400 | Vrd | 0 | 0 | Vrd |
| | 401 | Vrd | Vdd | 0 | Vrd |
| | 402 | 0 | 0 | 0 | Vrd |
| | 403 | 0 | Vdd | 0 | Vrd |

FIG. 8

| | Unit | BL | WL | COM | N-well |
|---|---|---|---|---|---|
| Programmable unit 400 | 400 | Vpp | 0 | 0 | Vpp |
| | 401 | Vpp | Vpp | 0 | Vpp |
| | 402 | 0 | 0 | 0 | Vpp |
| | 403 | 0 | Vpp | 0 | Vpp |
| Reading unit 400 | 400 | Vrd | 0 | 0 | Vrd |
| | 401 | Vrd | Vdd | 0 | Vrd |
| | 402 | 0 | 0 | 0 | Vrd |
| | 403 | 0 | Vdd | 0 | Vrd |

SINGLE-LAYER POLYSILICON NONVOLATILE MEMORY CELL AND MEMORY INCLUDING THE SAME

CROSS-REFERENCE TO RELATED APPLICATIONS

This application claims the benefit of Chinese Patent Application Nos. 2020110831736, filed on Oct. 12, 2020, and 2019110775659, filed on Nov. 6, 2019, each of which is incorporated herein by reference in its entirety.

TECHNICAL FIELD

The present invention relates to a single-layer polysilicon nonvolatile memory cell and a memory including the same, and in particular to a one-time programmable nonvolatile memory cell and a memory including the same.

TECHNICAL BACKGROUND

A nonvolatile memory has the advantages that data will not disappear even if power is off after being stored, and can retain the data for a long time. Therefore, it is currently widely used in an electronic device. A single-layer polysilicon nonvolatile memory is very rapidly developed, with simple structure and stable performance, and is widely used in various integrated circuits.

A single-layer polysilicon nonvolatile memory is classified into a multiple-erasable programmable memory and a one-time programmable memory. A memory cell of the multi-erasable programmable memory has generally a very large area, which cannot meet the demand for large-capacity storage. Further, the cost is high. One-time programmable memory is relatively weak in programming ability and low in data retention ability.

In addition, the nonvolatile memory continues to be developed in a direction of saving space, and is dedicated to reducing the size and increasing the integration.

As a result, the industry continues to demand the programmable memory to be smaller in size, stronger in programming capability, and higher in data retention capability.

SUMMARY OF THE INVENTION

The invention relates to a single-layer polysilicon nonvolatile memory cell, an array thereof and a storage structure thereof, in particular to a one-time programmable memory cell and a memory including the same.

A first aspect of the invention relates to a single-layer polysilicon nonvolatile memory cell structure, comprising a selection transistor and a storage transistor, both of which are located in a substrate. The selection transistor comprises a selection gate, as well as a gate oxide, a source electrode and a drain electrode under the selection gate. The storage transistor comprises a floating gate, a gate oxide, a source electrode and a drain electrode under the floating gate. The selection transistor is connected in series with the storage transistor, and the selection transistor and the storage transistor are arranged on the substrate in a mutually perpendicular manner.

In one preferable embodiment, the memory cell structure further comprises a capacitor. The capacitor and the selection transistor are located on opposite sides of the storage transistor, and the capacitor is formed such that the floating gate of the storage transistor and the gate oxide thereof are distal from one end of the selection transistor, extend in the direction perpendicular to and away from the selection transistor, and cover one part of the substrate to form the capacitor.

In yet one preferable embodiment, the selection transistor and the storage transistor in the memory cell are of the same type, for example both are PMOS transistors or both are NMOS transistors. In the case where both transistors are PMOS transistors, the substrate is an N-well, and a P substrate is provided under the N-well.

A second aspect of the present invention relates to a single-layer polysilicon nonvolatile memory cell group structure, comprising four memory cells of the present invention, which are arranged in a center symmetrical array of two rows×two columns, and substrates of all memory cells are integral. The two memory cells in each row are in left-right mirror-symmetry. Two selection transistors are arranged on both sides of a group. The two storage transistors are adjacent to each other in the middle thereof. An active region is provided at the center of each row and located in the substrate between two storage transistors. The two memory cells in each column are in up-down mirror-symmetry. Floating gates of the upper and lower selection transistors are communicated integrally up and down. The upper and lower storage transistors share one source electrode which is sandwiched between the upper and lower storage transistors. The doping type of the active region is the same as that of a shared source electrode region. The active regions at the centers of upper and lower rows are communicated integrally up and down, and connected to the shared source electrode between the upper and lower rows and between the upper and lower storage transistors on left and right sides thereof.

In one preferable embodiment, the four memory cells in the memory cell group are completely the same. The compositions, constituents, structures and other aspects of each part are the same.

In one preferable embodiment, each of the memory cells further comprises a capacitor. The capacitor and the selection transistor are located at opposite sides of the storage transistor, respectively, and formed as follows: a floating gate of the storage transistor and a gate oxide thereof are distal from one end of the selection transistor, extend in a direction perpendicular to and away from the selection transistor, and cover part of the substrate to form the capacitor; and the active region at the center of each row is located between the two capacitors of the two memory cells in left and right thereof.

In another preferable embodiment, all the selection transistors and the storage transistors in the memory cell group are of the same type. In the case where the transistor is a PMOS transistor, the substrate is the N-well. the P substrate is provided under the N-well, and the active region is a P-doped region.

In yet another preferable embodiment, the memory cell group structure further comprises a bit line in each row which is connected to a drain electrode of the selection transistor of each memory cell in the row, a word line in each column which is connected to a gate electrode of the selection transistor of each memory cell in the column; and a shared line between the two columns which is connected to an active region between the two storage transistors in the two columns, and connected to the source electrodes of the storage transistors of all the memory cells in the group via the active region.

In yet another preferable embodiment, in the memory cell group structure, a contact is provided in the active region located at the center of the group between four centrally symmetrically arranged storage transistors, and the shared line is connected to the contact, and thus connected to the source electrodes of all the storage transistors in the group via the active region.

A third aspect of the present invention relates to a single-layer polysilicon nonvolatile memory structure, comprising at least one nonvolatile memory cell group of the present invention to form an array. The arrangement of each group in the array is the same. Substrates of memory cells of each group are integral to form a substrate of the array. Floating gates of selection transistors at the upper and lower corresponding positions of different groups in each column are communicated up and down to form integrally. All active regions at the center of a row at the upper and lower corresponding positions of different groups in each column are communicated up and down to form integrally. One bit line is provided in each row and connected to drain electrodes of selection transistors of all the memory cells in each group in the row. One shared line is provided between two adjacent columns, connected to an active region between the two storage transistors of each group in the column, and connected to source electrodes of all the storage transistors in each group via the active region.

In another preferable embodiment, each group in the storage array is the same. The compositions, structures, arrangement and other aspects are the same.

In yet another preferable embodiment, in a memory array, a contact is provided in an active region located at the center of the group between four centrally symmetrically arranged storage transistors in each group, and the shared line is connected to the contact, and thus is connected to the source electrodes of all the storage transistors in each group via the active region.

A fourth aspect of the present invention relates to the use of the above memory cell and a memory thereof, which are used as a one-time programmable memory cell and a one-time programmable memory.

The memory cell and the memory of the present invention can reduce an area and cost through optimized structure and arrangement of various elements while improving programming efficiency and data retention ability, without the need to adjust a chip process to meet the data retention ability of the memory.

The single-layer polysilicon memory cell and the memory of the present invention can be manufactured by using a 130 nm or 180 nm logic process.

BRIEF DESCRIPTION OF THE DRAWINGS

FIG. 1b shows a sectional view taken along a section line A-A in FIG. 1a.

FIG. 2a shows a top view of a memory cell array in the same embodiment as shown in FIG. 1a.

FIG. 2b shows a sectional view of a memory cell group structure of an upper group taken along a section line B-B in FIG. 2a.

FIG. 3b shows a sectional view taken along a section line A-A in FIG. 3a.

FIG. 4a shows a top view of a memory cell array in the same embodiment as shown in FIG. 3a.

FIG. 4b shows a sectional view of a memory cell group structure of an upper group taken along a section line B-B in FIG. 4a.

FIG. 6 shows bias signals of a memory cell group array connected to an array during different operations shown in FIG. 5.

FIG. 8 shows the bias signals of a memory cell group array connected to an array during different operations shown in FIG. 7.

The same numbers in the drawings indicate similar elements.

Figure 1A:
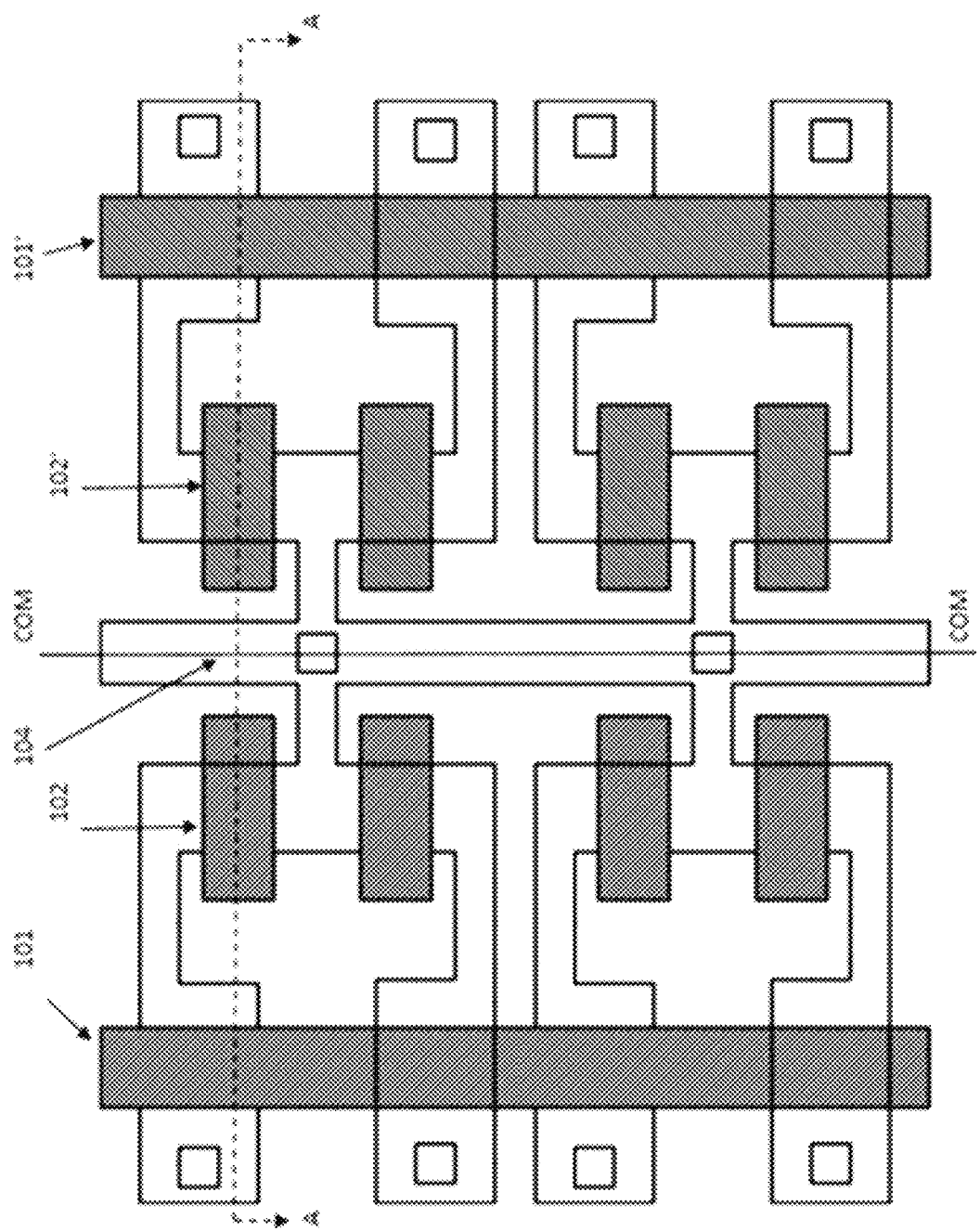
FIG. 1a shows a top view of a group array comprising memory cells without a capacitor of upper and lower groups according to one embodiment of the present invention.

An embodiment of the present invention is explained by way of examples, and is not limited to the examples shown in the pictures of the drawings. It should be understood that the drawings only show certain embodiments of the present invention, and therefore should not be regarded as limiting the scope. The person skilled in the art can also obtain other related drawings based on drawings without the need for creative labor.

DETAILED DESCRIPTION

In a single-layer polysilicon nonvolatile memory cell of the present invention, a selection transistor is connected in series with a storage transistor, and the selection transistor and the storage transistor are arranged on a substrate in a mutually perpendicular manner. This can avoid increasing a spacing between active regions of the two transistors under the premise of increasing the area of a memory cell, that is, increase an isolation region of a shallow trench between the two transistors, thereby effectively separating active regions of the two transistors. This is particularly beneficial for a transistor memory that is shrinking in size. During the preparation and processing thereof, when ion implantation forms source and drain electrodes of the active region, the increased spacing between the active regions can ensure that the source and drain electrodes of the active regions of the two transistors are fully formed, thereby reducing the impedance between the two transistors, improving the programming efficiency during work and also increasing a read current after programming.

A memory cell structure of the present invention may not comprise a capacitor, or may comprise the capacitor. Preferably, the capacitor is comprised, and is formed such that one end of a floating gate of the storage transistor away from the selection transistor, extends in a direction perpendicular to and away from the selection transistor, and covers one small part of the substrate to form a small capacitor. The floating gate is an upper electrode plate of the capacitor. The substrate is a lower electrode plate of the capacitor, and a gate oxide under the floating gate is a medium between the two electrode plates.

During a programming operation, the capacitor can couple the potential of the substrate to the floating gate of the storage transistor, which is conducive to more hot electrons being injected into the floating gate faster, thereby improving programming efficiency, and also improving the programming ability and data retention ability of the memory cell.

The selection transistor and the storage transistor in the memory cell of the present invention are preferably of the same type, and both are PMOS transistors or both are NMOS transistors.

In the case where the two transistors are of PMOS type, the substrate is an N-well, and a P substrate is provided under the N-well.

In the case where the two transistors are of the NMOS type, the substrate is a P-well, and a deep N-well is preferably under the P-well and located on the P substrate.

A single-layer polysilicon nonvolatile memory cell group structure of the present invention comprises four above-mentioned memory cells of the present invention, which are arranged in a centrally symmetrical array of two rows×two columns. The substrates of all the memory cells are integrated into one. The two memory cells in each row are left-right mirror-symmetrical. Two of the selection transistors are arranged on both sides of a group. The two storage transistors are adjacent to each other in the middle. One active region is provided at the center of each row and located in the substrate between the two storage transistors. The two memory cells in each column are in up-down mirror-symmetry. Floating gates of the upper and lower selection transistors are communicated up and down integrally. The upper and lower storage transistors share one source electrode which is sandwiched between the upper and lower storage transistors. The doping type of the active region is the same as that of a shared source electrode region, and active regions at the centers of the upper and lower rows are communicated integrally up and down. A shared source electrode between the upper and lower storage transistors on the left and right sides and between the upper and lower rows are connected.

Four memory cells in an aforementioned memory cell group may be the same or different and is preferably completely the same, and the compositions, constituents, structures and so on of each part thereof are completely the same in all aspects.

In the case where the memory cell in the memory cell group comprises the capacitor, the active region at the center of each row in the group is located between the two capacitors of the left and right memory cells.

All of the selection transistors and the storage transistors in the memory cell group are preferably of the same type. In the case of a PMOS type transistor, the substrate is an N-well and a P substrate is provided under the N-well. The active region is a P-doped region. In the case of an NMOS type transistor, the substrate is the P-well, and the deep N-well is preferably provided under the P-well and located on the P substrate.

The memory cell group also comprises: one bit line in each row which is connected to a drain electrode of the selection transistor of each memory cell in the row, one word line in each column which is connected to a gate electrode of the selection transistor of each memory cell in the column, and one shared line between the two columns which is connected to an active region between the two storage transistors in the two columns and connected to a source electrode of the storage transistors of all the memory cells in the group via the active region. One contact is provided in the active region located at the center of the group between four centrally symmetrically arranged storage transistors. The shared line is connected to the contact, and thus is connected to the source electrode of all the storage transistors in the group via the active region.

The two columns in the group structure share one shared line. The four storage transistors in the group share one contact to be communicated with the shared line, which helps reduce the area of the memory cell group, simplify the processing steps in the preparation process and cut cost.

A single-layer polysilicon nonvolatile memory structure of the present invention comprises at least one of the above-mentioned nonvolatile memory cell group of the present invention, which forms one array. Each group is arranged in the same manner in the array. The substrates of the memory cells of each group are combined integrally to form the substrate of the array. The floating gates of the selection transistors at the upper and lower corresponding positions of the different groups in each column are communicated up and down to form integrally. An active region in the center of the row at the upper and lower corresponding positions of the different groups in each column is communicated up and down to form integrally. One bit line is provided in each row and connected to the drain electrode of the selection transistors of all the memory cells in each group in the row. One word line is provided in each column and connected to the gate electrodes of the selection transistors of all the memory cells in each group in the column. One shared line is provided between two adjacent columns, connected to the active region between the two storage transistors in each group in the column, and connected to the source electrodes of all the storage transistors in each group via the active region.

Each group in a memory array may be the same or different. Preferably, each group is completely the same. The compositions, structures, and other aspects thereof are completely the same.

In the memory array of the present invention, two adjacent columns in each group share one shared line. Four storage transistors in each group share one contact to be communicated with the shared line, which helps reduce the area of the array, simplify processing steps in a preparation process and reduce cost.

Each nonvolatile memory cell in the memory cell group of the present invention and the array thereof can be independently programmed.

The memory cell, the group structure and an array structure of the present invention will be described below with reference to the drawings. Obviously, specific embodiments described in the drawings are only a part of embodiments of the present invention, rather than all embodiments. The components of the embodiments of the present invention generally described and illustrated in the drawings herein may be arranged and designed in various different configurations. Therefore, the following detailed description of embodiments of the present invention provided in the drawings is not intended to limit the claimed scope of the present invention, but merely represents selected embodiments of the present invention. Based on embodiments of the present invention, all other embodiments obtained by the person skilled in the art without creative work shall fall within the protection scope of the present invention.

Figure 1B:
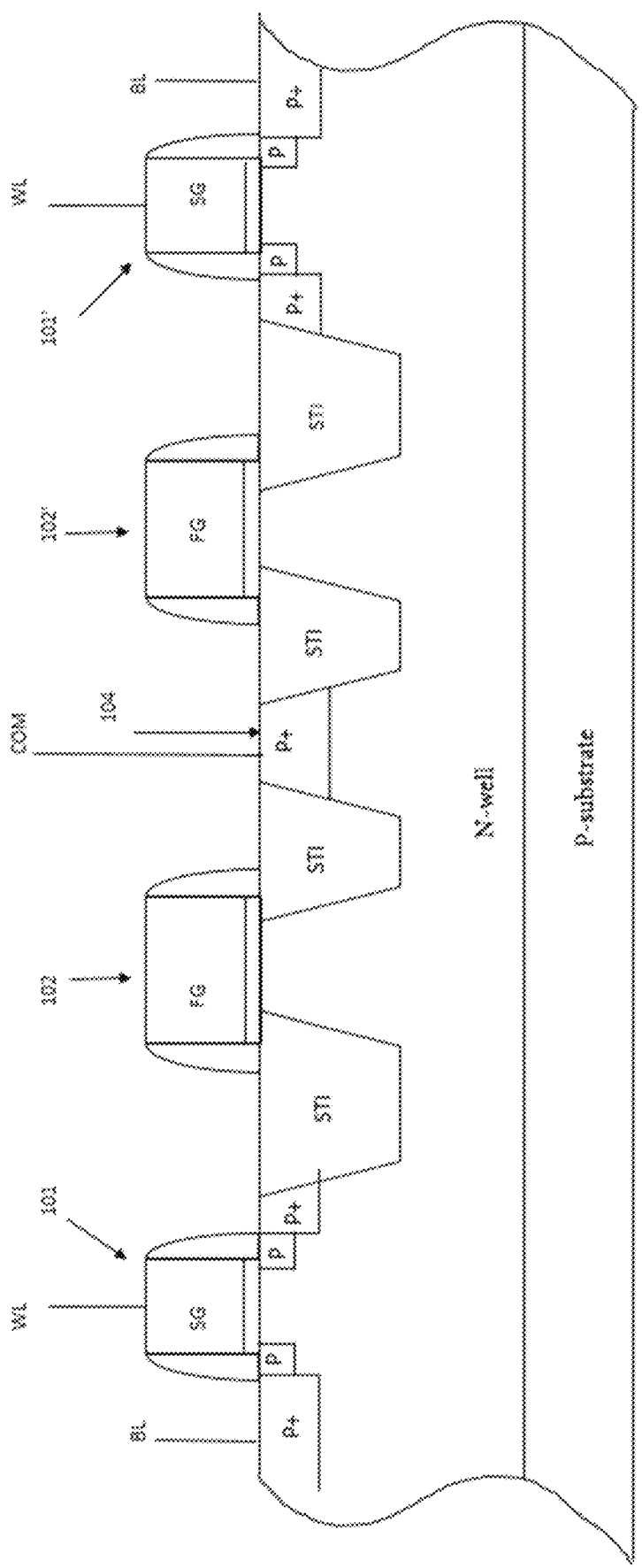
Figure 2A:
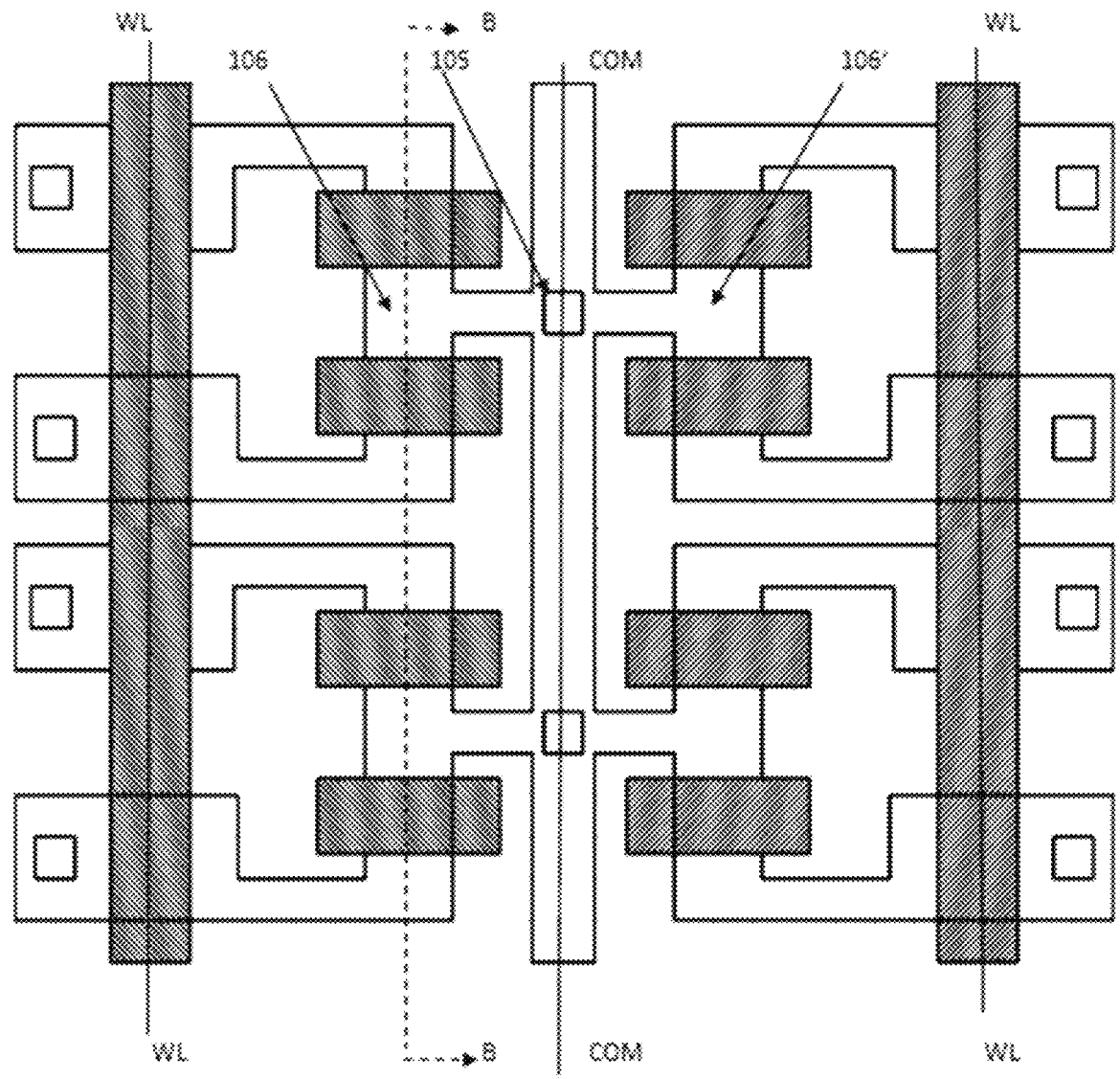
Figure 2B:
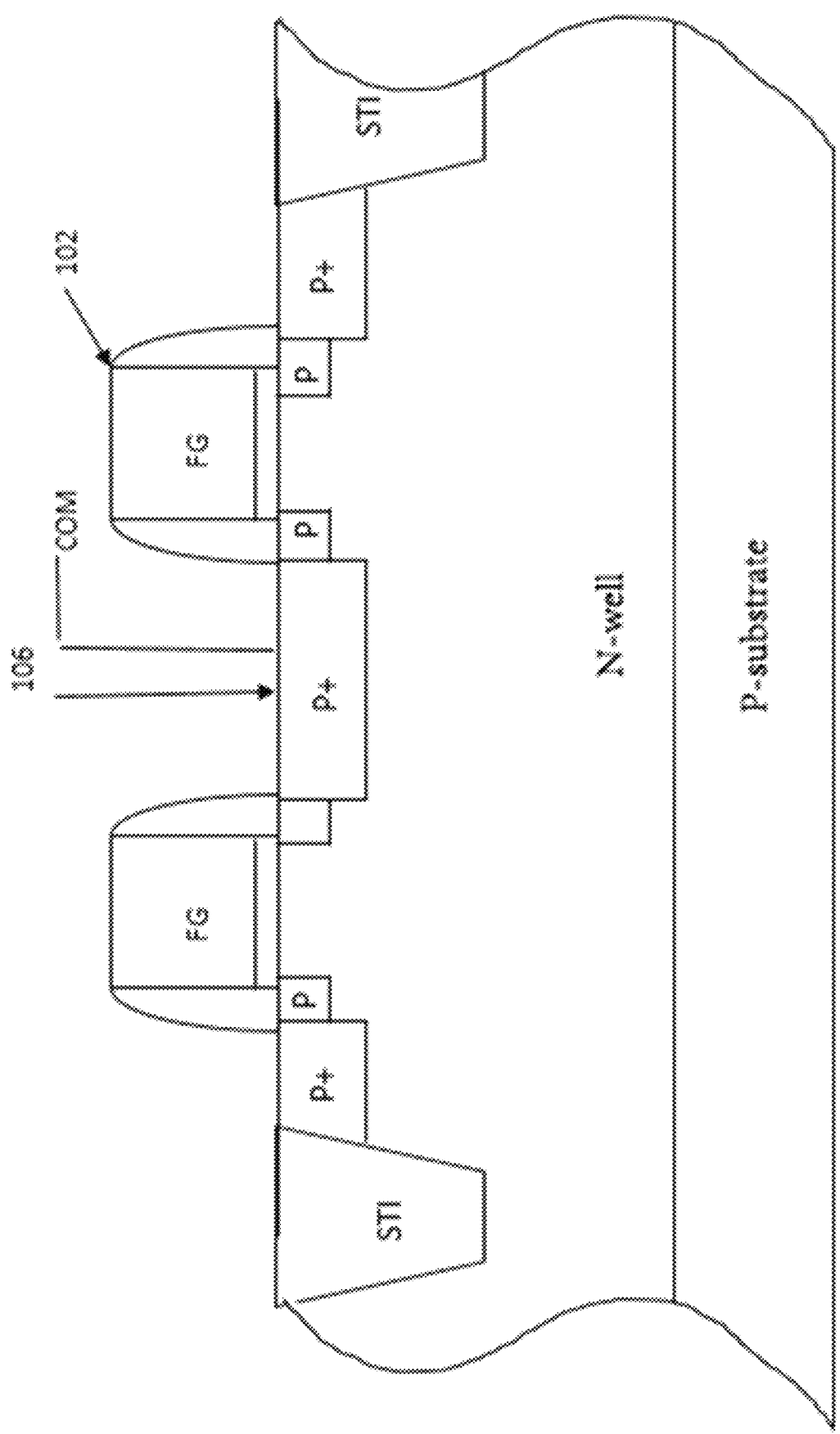

FIG. 1a shows a group array comprising memory cells without the capacitor in the upper and lower groups according to an embodiment of the present invention. The group array in FIG. 2a is the same as that of FIG. 1a. FIG. 1b is a sectional view taken along a section line A-A in FIG. 1a. FIG. 2b is a sectional view of the upper group taken along a section line B-B in FIG. 2a. The sectional view of the lower group is the same as that of the upper group.

One memory cell in FIG. 1a comprises one selection transistor 101 and a storage transistor 102, both of which are PMOS transistors and located in an N-well substrate. The N-well substrate is located on a P substrate. A gate is provided in the selection transistor, and also called a selection gate (SG), which is connected to a word line (WL). A drain electrode of the selection transistor is connected to a bit line (BL). The selection transistor 101 is connected in series with the storage transistor 102. The selection transistor 101 and the storage transistor 102 are arranged in the N-well in a mutually perpendicular arrangement at intervals. Active regions of the selection transistor 101 and the storage transistor 102 are separated by a shallow trench region (STI). The floating gate (FG) is provided in the storage transistor 102.

A group structure of the memory cells without the capacitor of each group shown in FIG. 1*a* comprises four memory cells located in the same N-well. The four memory cells are arranged in a center-symmetrical array of two rows×two columns. The four memory cells in the group are the same, and the compositions, constituents, and structures and so on of the four memory cells are completely the same, but the arrangement positions and orientations of the four memory cells are different.

The above group is taken as an example. The two memory cells in each row are in left-right mirror-symmetry. For example, the two selection transistors 101 and 101' in a first row are arranged on both sides of the upper group. The two storage transistors 102 and 102 are adjacent to the middle in left and right. A P-type active region 104 is provided at the center of the first row and located in the N-well substrate between the two storage transistors 102 and 102'.

In this group, the two memory cells in each column are in up-down mirror-symmetry. The floating gates of the upper and lower selection transistors are communicated integrally up and down. The upper and lower storage transistors share one source electrode, which is sandwiched between the upper and lower storage transistors. For example, the upper and lower storage transistors in a first column share one source electrode 106.

In this group, a P active region 104 at the center of the upper and lower rows is communicated integrally up and down and connected to the shared source electrodes 106 and 106' between the upper and lower rows and between the upper and lower storage transistors on the left and right sides.

In this group, a contact hole 105 is provided in an active region 104 located at the center of the group between the four centrally symmetrically storage transistors. A shared line COM is connected to the contact and connected to the source electrodes 106 and 106' of all the storage transistors in the group via the active region 104.

In each group, one bit line (BL) is provided in each row and connected to the drain electrode of the selection transistor of each memory cell in the row. One word line (WL) is provided in each column and connected a gate electrode of the selection transistor of each memory cell in the column.

One shared line (COM) is provided between two adjacent columns in each group, connected to the active region between the two storage transistors in the group, and connected to the source electrode of the storage transistors of all the memory cells in the group via the active region.

An array of a memory cell group shown in FIG. 1*a* comprises upper and lower two memory cell groups of the present invention. The arrangement manner of each group in the array is the same. The substrates of the memory cells of each group are combined integrally, and form an N-well substrate of the array. The floating gates of the selection transistors at the upper and lower corresponding positions of the upper and lower groups in each column are communicated integrally up and down. An active region at the center of the row at the upper and lower corresponding positions of the upper and lower groups in each column is communicated integrally up and down. One bit line (BL) is provided in each row and connected to the drain electrodes of the selection transistors of all the memory cells in the row. One word line (WL) is provided in each column and connected to the gate electrodes of the selection transistors of all the memory cells of each group in the column. One shared line (COM) is provided between two adjacent columns, connected to the active region between the two storage transistors in the column, and connected to the source electrodes of all the storage transistors of each group via the active region.

In the array, each group is the same, and the compositions, constituents, structures, arrangement and so on thereof are all the same.

Figure 3A:
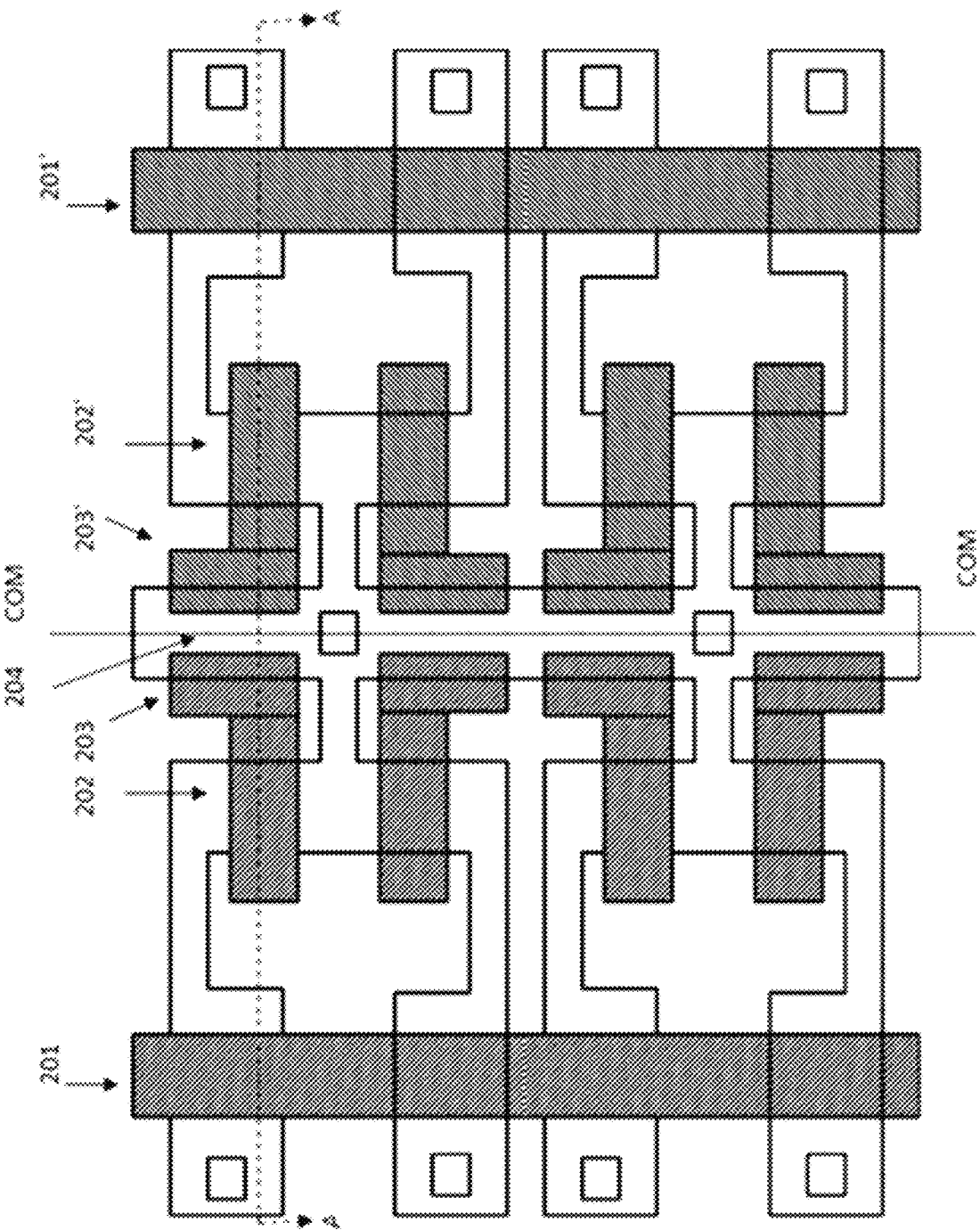
FIG. 3a shows a top view of a group array comprising memory cells with capacitors two in upper and lower groups according to one embodiment of the present invention.
Figure 3B:
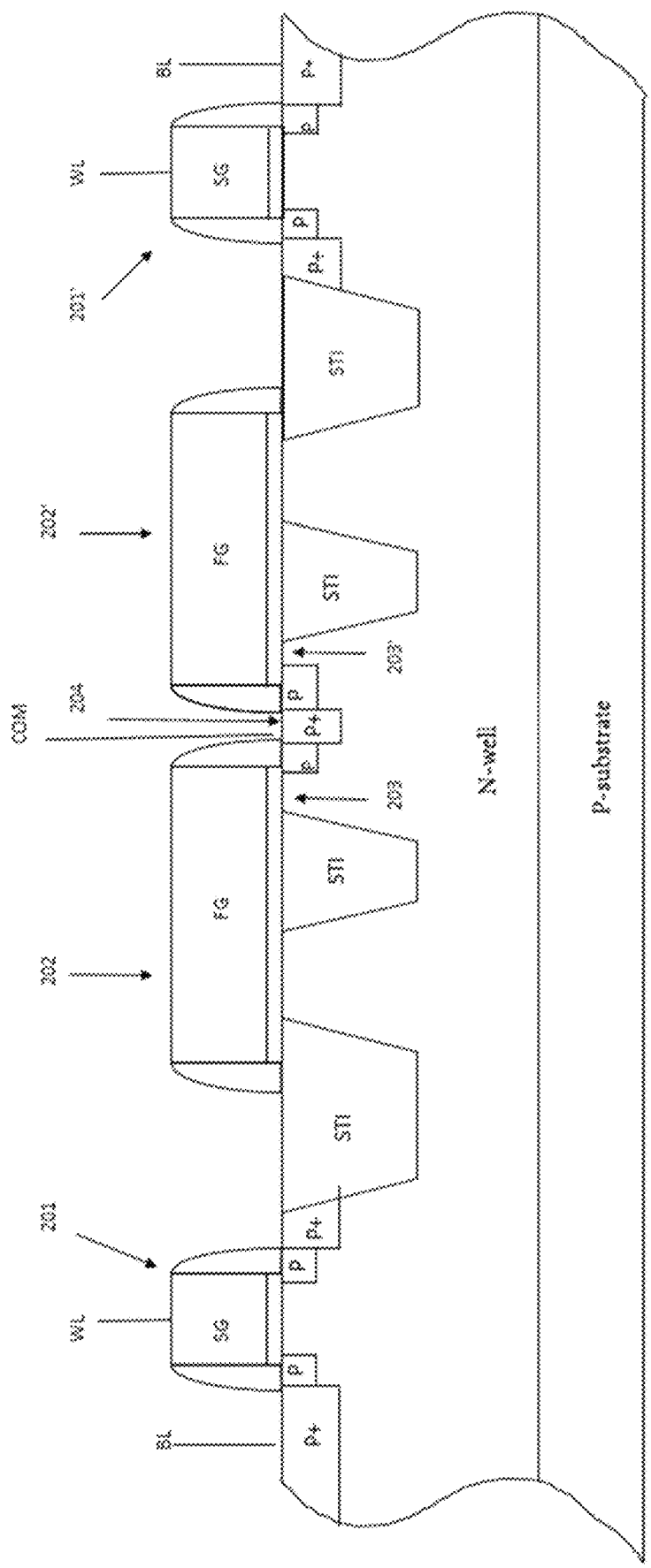
Figure 4A:
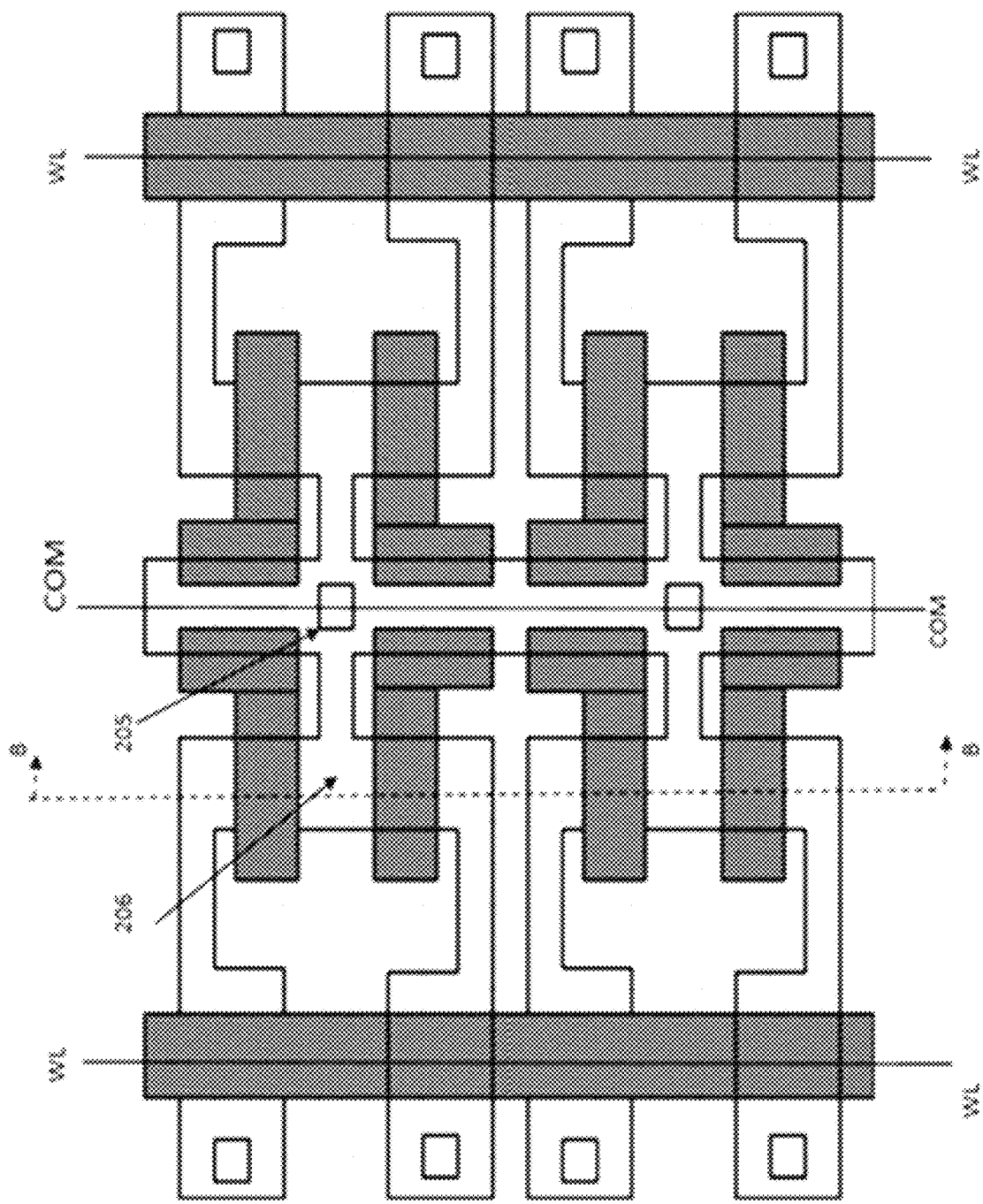
Figure 4B:
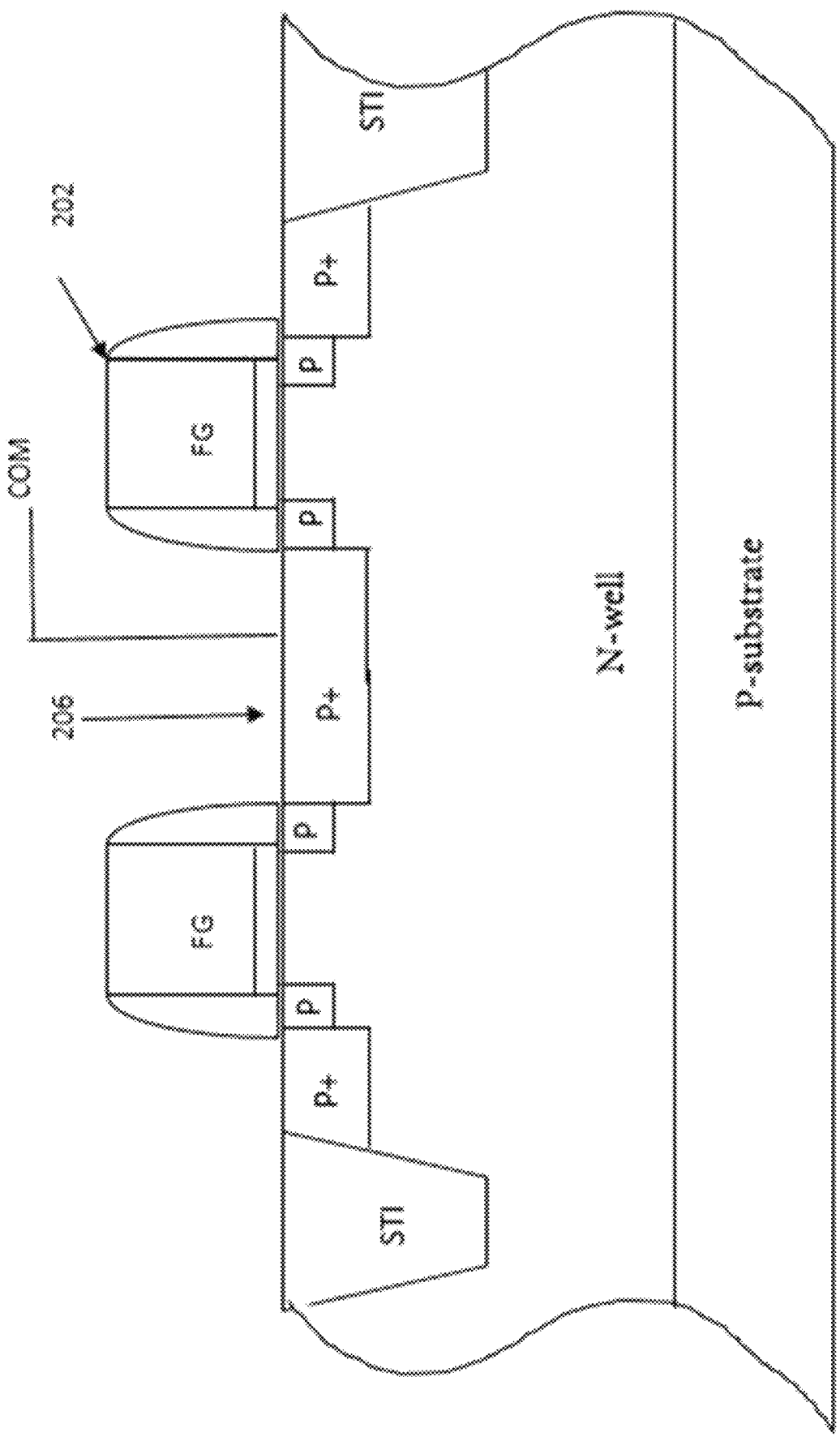

FIG. 3*a* shows a group array comprising memory cells with the capacitors in the upper and lower groups according to an embodiment of the present invention. The group array in FIG. 4*a* is the same as that of FIG. 3*a*. FIG. 3*b* is a sectional view taken along a section line A-A in FIG. 3*a*. FIG. 4*b* is a sectional view of the upper group taken along a section line B-B in FIG. 4*a*. The sectional view of the lower group is the same as that of the upper group.

One memory cell in FIG. 3*a* comprises a selection transistor 201, a storage transistor 202, and a capacitor 203. Both transistors are PMOS transistors and located in the N-well substrate. The N-well substrate is located on the P substrate. The floating gate is provided in the selection transistor, and also called the selection gate (SG), which is connected to the word line (WL). The drain electrode of the selection transistor is connected to the bit line (BL). The selection transistor 201 is connected in series with the storage transistor 202. The selection transistor 201 and the storage transistor 202 are arranged in the N-well in a mutually perpendicular arrangement at intervals. The active regions of the selection transistor 201 and the storage transistor 202 are separated by a shallow trench region (STI). The floating gate (FG) is provided in the storage transistor 202.

The capacitor 203 and the selection transistor 201 are located on both sides of the storage transistor 202, respectively. The capacitor is formed such that the floating gate of the storage transistor 202 and a gate oxide thereof are away from one end of the selection transistor 201, extend in a direction perpendicular to and away from the selection transistor, and cover one part of the surface of the substrate to form one capacitor.

The group structure of the memory cells with the capacitors of each group shown in FIG. 3*a* comprises four memory cells located in the same N-well. The four memory cells are arranged in a center-symmetrical array of two rows×two columns. The four memory cells in the group are the same and the compositions, constituents, and structures and so on of the four memory cells are completely the same, but the arrangement positions and orientations of the four memory cells are different.

The above group is taken as an example, the two memory cells in each row are in left-right mirror-symmetry. For example, the two selection transistors 201 and 201' in the first row are arranged on both sides of the upper group. The two storage transistors 202 and 202 are adjacent to the middle in left and right. The P-type active region 204 is located at the center of the first row and located in the N-well substrate between the two capacitors 203 and 203'.

In this group, the two memory cells in each column are in up-down mirror-symmetry. The floating gates of the upper and lower selection transistors are communicated integrally up and down. The upper and lower storage transistors share one source electrode, which is sandwiched between the upper and lower storage transistors. For example, the upper and lower storage transistors in the first column share one source electrode 206.

In this group, the P active region 204 at the center of the upper and lower rows is communicated integrally up and down and connected to the shared source electrodes 206 and 206' between the upper and lower storage transistors and between the upper and lower rows on the left and right sides.

In this group, a contact 205 is provided in the active region 204 located at the center of the group located between the four centrally symmetrically arranged storage transistors. The shared line COM is connected to the contact, and connected to the source electrodes 206 and 206' of all the storage transistors in the group via the active region 204.

In each group, one bit line (BL) is provided in each row and connected to the drain electrode of the selection transistor of each memory cell in the row. One word line (WL) is provided in each column, and connected to the gate electrode of the selection transistor of each memory cell in the column.

One shared line (COM) is provided between two adjacent columns in each group, connected to the active region between the two storage transistors in the group, and connected to the source electrodes of all the memory cells in the group via the active region.

The array of the memory cell groups shown in FIG. 3a comprises upper and lower two memory cell groups of the present invention. The arrangement manner of each group in the array is the same. The substrates of the memory cells of each group are combined integrally to form the N-well substrate of the array. The floating gates of the selection transistors at the upper and lower corresponding positions of the upper and lower groups in each column are communicated integrally up and down. The active region at the center of the row located at the up and lower corresponding positions of the upper and lower groups in each column is connected integrally up and down. One bit line (BL) is provided in each row and connected to the drain electrodes of the selection transistors of all the memory cells in the row. One word line (WL) is provided in each column and connected to the gate electrodes of the selection transistors of all the memory cells of each group in the column. One shared line (COM) is provided between two adjacent columns, connected to the active region between the two storage transistors in the column, and connected to the source electrodes of all the storage transistors of each group via the active region.

In the array, each group is completely the same, and the compositions, constituents, structures, arrangements of each group are completely the same.

Figure 5:
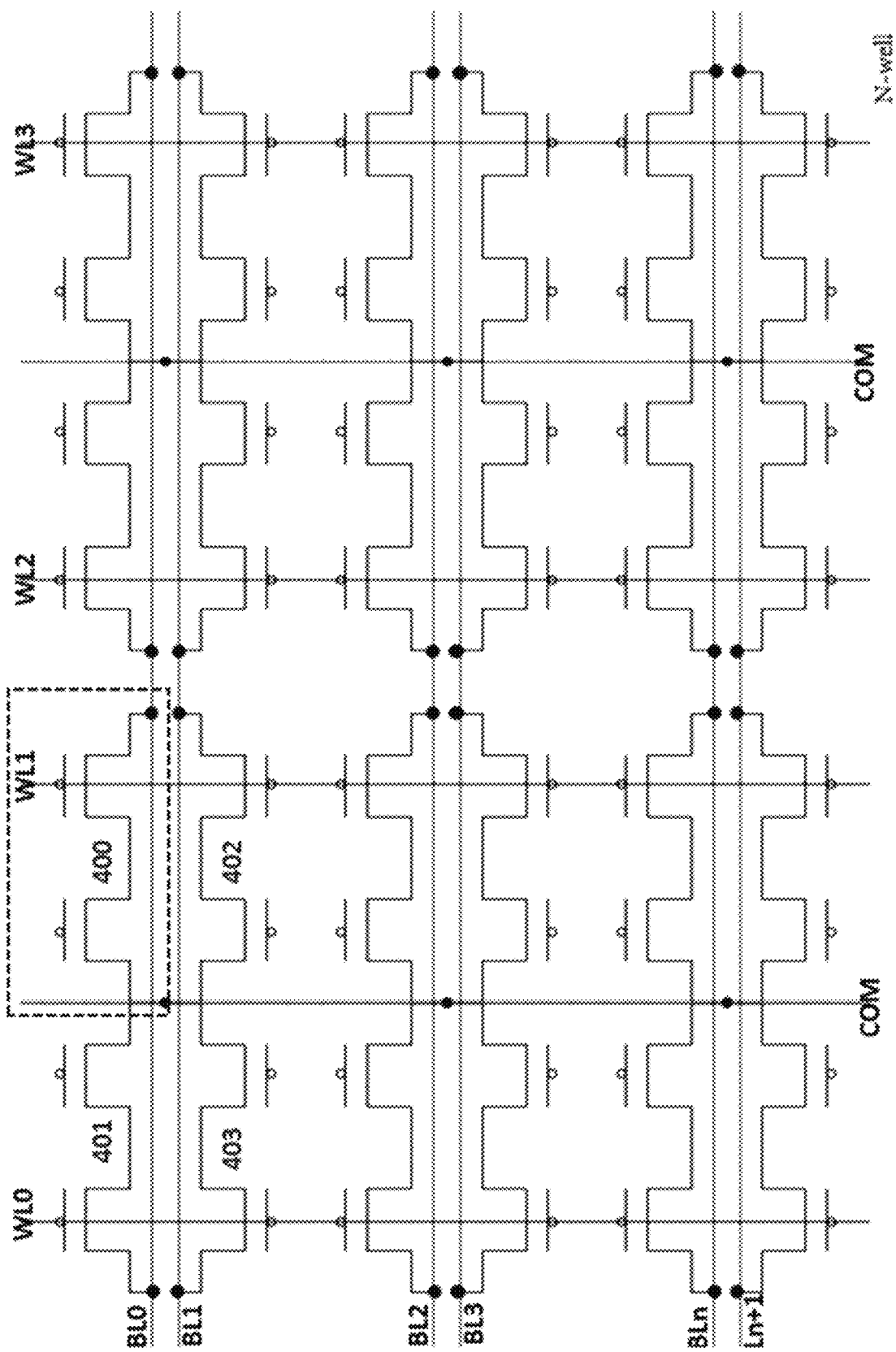
FIG. 5 shows a group array comprising six groups (2×3) of memory cells without a capacitor in one embodiment of the present invention.

FIG. 5 shows an array of six groups (2×3) of the memory cells without the capacitors of the present invention. Take the first group in the array as an example the operating voltage thereof and the working process thereof are illustrated.

FIG. 6 shows bias signals of a first memory cell group in the array connected to the array during different operations shown in FIG. 5. In FIG. 6, Vpp is a positive high voltage. For a 5 v process, Vpp is, for example, 7-8 v. Vrd is an operating voltage (a positive voltage) during reading, for example, approximately 2 v. Vdd is a power supply voltage, for example, 5 v or 3.3 v.

Each memory cell in the group can be independently programmed. During programming, electrons are injected into the floating gate of a selected unit, causing a threshold voltage of the reading transistor to decrease, making it easier to turn on, thereby causing the reading current during the read operation to increase. During programming, the BL and the N-well are driven to a high voltage Vpp (for example, 7-8 v). The P substrate is grounded.

In working operation, one memory cell in the group can be designated for programming.

As shown in FIG. 6, in the working operation, it is assumed that the memory cell 400 in the first group is designated as a programming unit and a reading unit. The memory cell 400 can be programmed as follows: WL is driven to 0 v; BL is driven to Vpp; COM is driven to 0 v, and the N-well is driven to Vpp. Since the gate potential WL of the selection transistor in the memory cell 400 is 0, which is lower than the BL potential, the selection transistor is turned on and the BL is connected to the drain electrode of the storage transistor, causing Vpp applied between the source and drain electrodes of the storage transistor to be the high voltage difference, generating a high lateral electric field across a channel. Therefore, high-energy hot electrons are generated in a drain electrode depletion region. At the same time, the floating gate is programmed and coupled to a positive potential. The hot electrons generated by impact ionization are attracted by the floating gate and injected into the floating gate. Therefore, the number of electrons in the floating gate increases during programming.

The WL potential of the gate electrode and the BL potential of the selection transistor of the memory cell 401 are the same, which are both Vpp. The selection transistor cannot be turned on. Therefore, a lateral electric field cannot be formed between the source and drain electrodes of the storage transistor. No hot electrons are generated and programming cannot be performed.

The WL potential of the gate electrode of the selection transistor of the memory cell 402 is 0, and is the same as the BL potential. The selection transistor is not turned on. And no potential difference is provided between the drain and source electrodes of the storage transistor. The lateral electric field cannot be formed, so programming cannot be performed.

The WL potential of the gate electrode of the selection transistor of the memory cell 403 is higher than the BL potential. The selection transistor cannot be turned on. Therefore, the lateral electric field cannot be formed between the source and drain electrodes of the storage transistor, and programming cannot be performed.

As shown in FIG. 6, when the memory cell 400 is designated as a read cell, the gate WL potential of the selection transistor is 0, which is lower than the BL potential Vrd, and the selection transistor is turned on, so that BL is connected to the drain of the storage transistor, and the storage There is a potential difference between the source and drain of the transistor, forming an electric field. The storage transistor in the programmed 400 unit stores a large amount of electrons after programming, so the storage transistor is turned on, and the read current is generated under the action of the channel transverse electric field of the storage transistor.

In the memory cell 401, the WL potential of the gate electrode of the selection transistor is Vdd, which is higher than the BL potential. The selection transistor is turned off. Therefore, no BL current is generated in the memory cell 401.

In the memory cell 402, the WL potential of the gate electrode of the selection transistor is 0, which is the same as the BL potential. The selection transistor is not turned on.

No lateral electric field is formed at source and drain terminals of the storage transistor.

In the memory cell 403, the WL potential of the gate electrode of the selection transistor is Vdd, which is higher than the BL potential. The selection transistor is turned off.

Figure 7:
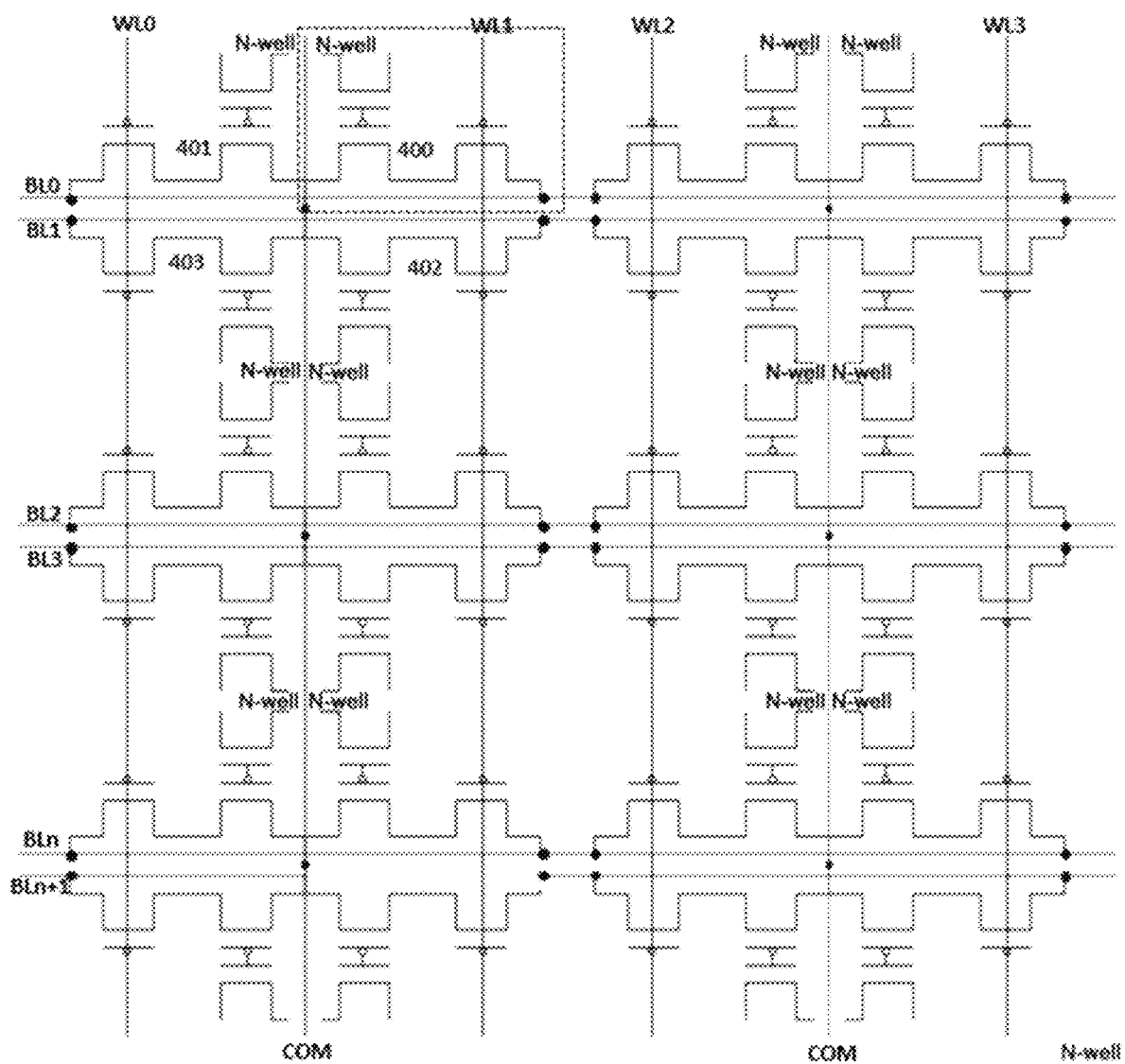
FIG. 7 shows a group array comprising six groups (2×3) of memory cells with capacitors in one embodiment of the present invention.

FIG. 7 shows a group array comprising six groups (2×3) of the memory cells with the capacitors of the present invention. FIG. 8 shows the bias signals of the first memory cell group in the array connected to the array during different operations shown in FIG. 7. The programming operation and reading operation are the same as those of the above-mentioned group array of the memory cells without the capacitors. The difference is that when the capacitor is provided in the memory cell, in the programming operation, since the N-well substrate is at a high potential, the capacitor is beneficial to coupling the floating gate of the storage transistor in the memory cell to the high potential, so that the floating gate can capture more hot electrons faster during programming, improving programming efficiency, and improving data retention ability.

The invention claimed is:

1. A single-layer polysilicon nonvolatile memory cell structure, comprising a selection transistor and one storage transistor, both of which are in one substrate, and a capacitor, wherein the selection transistor comprises a selection gate, a gate oxide, a source electrode and a drain electrode under the selection gate; the storage transistor comprises a floating gate, a gate oxide, a source electrode and a drain electrode under the floating gate; the selection transistor is connected in series with the storage transistor, and the selection transistor and the storage transistor are mutually perpendicular to each other on the substrate; the capacitor and the selection transistor are on opposite sides of the storage transistor; and the floating gate and the gate oxide of the storage transistor are distal from one end of the selection transistor, extend in a direction perpendicular to and away from the selection transistor, and cover part of the substrate to form the capacitor.

2. The single-layer polysilicon nonvolatile memory cell structure according to claim 1, wherein the selection transistor and the storage transistor are both either PMOS transistors or NMOS transistors.

3. The single-layer polysilicon nonvolatile memory cell structure according to claim 1, wherein the single-layer polysilicon nonvolatile memory cell structure is a one-time programmable memory cell.

4. The single-layer polysilicon nonvolatile memory structure according to claim 3, wherein the single-layer polysilicon nonvolatile memory structure is a one-time programmable memory.

5. A single-layer polycrystalline silicon nonvolatile memory cell group structure, comprising four memory cells in an array of two rows×two columns, and the substrates of the memory cells are integral, wherein:
each of the four memory cells comprises a selection transistor and a storage transistor, both of which are in one substrate, wherein the selection transistor comprises a selection gate, a gate oxide, a source electrode and a drain electrode under the selection gate; the storage transistor comprises a floating gate, a gate oxide, a source electrode and a drain electrode under the floating gate; the selection transistor is connected in series with the storage transistor, and the selection transistor and the storage transistor are mutually perpendicular to each other on the substrate;
in each row, the two memory cells are in left-right mirror-symmetry, the two selection transistors are on opposite sides of a group, the two storage transistors are adjacent to each other, and an active region is in a center of the row, in the substrate between the two storage transistors;
in each column, the two memory cells are in up-down mirror-symmetry, the selection gates of the selection transistors communicate integrally, and the storage transistors share one source electrode between the storage transistors;
the active region has a same doping type as that of the shared source electrode, and the active regions in the two rows communicate integrally, and are connected to the shared source electrodes in the two columns between the respective storage transistors.

6. The single-layer polycrystalline silicon nonvolatile memory cell group structure according to claim 5, wherein the four memory cells in the array have identical constituents and structures.

7. The single-layer polycrystalline silicon nonvolatile memory cell group structure according to claim 5, wherein each of the memory cells further comprises a capacitor, and in each memory cell, the capacitor and the selection transistor are on opposite sides of the storage transistor; the floating gate and the gate oxide of the storage transistor are distal from one end of the selection transistor, extend in a direction perpendicular to and away from the selection transistor, and cover part of the substrate to form the capacitor; and the active region in each row is between the two capacitors in each of the rows.

8. The single-layer polycrystalline silicon nonvolatile memory cell group structure according to claim 5, further comprising:
a bit line in each row which is connected to the drain electrode of the selection transistor of each memory cell in the row;
a word line in each column which is connected to the gate electrode of the selection transistor of each memory cell in the column; and
a shared line between the two columns which is connected to the active regions between the two storage transistors in each of the two rows.

9. The single-layer polycrystalline silicon nonvolatile memory cell group structure according to claim 8, further comprising a contact to the active region between the four storage transistors, wherein the shared line is connected to the contact.

10. A single-layer polysilicon nonvolatile memory structure, comprising a plurality of nonvolatile memory cell group structures to form a group array, wherein an arrangement of each group structure in the group array is identical;
each of the nonvolatile memory cell group structures comprises four memory cells in an array of two rows× two columns and substrates of the memory cells are integral, each of the four memory cells comprises a selection transistor and a storage transistor, both of which are in one substrate, wherein the selection transistor comprises a selection gate, a gate oxide, a source electrode and a drain electrode under the selection gate; the storage transistor comprises a floating gate, a gate oxide, a source electrode and a drain electrode under the floating gate; the selection transistor is connected in series with the storage transistor, and the selection transistor and the storage transistor are mutually perpendicular to each other on the substrate; in each row, the two memory cells are in left-right mirror-symmetry, the two selection transistors are on opposite sides of a group, the two storage transistors are adjacent to each other, and an active region is in a center of the row, in the substrate between the two storage transistors; in each column, the two memory cells are in up-down mirror-symmetry, the selection gates of the selection transistors communicate integrally, and the storage transistors share one source electrode between the storage transistors; and the active region has a same doping type as that of the shared source electrode, and the active regions in the two rows communicate integrally, and are connected to the shared source electrodes in the two columns between the respective storage transistors;

the selection gates of the selection transistors in corresponding columns of adjacent group structures communicate integrally;

the active regions in adjacent groups in a column direction communicate integrally;

each row of each group structure comprises a bit line connected to the drain electrodes of each selection transistor in the row;

each column of each group structure comprises a word line connected to the selection gate of each selection transistor in the column; and the memory structure further comprises a shared line between the two columns in each group structure, connected to the active region between the two storage transistors each row of the memory structure.

11. The single-layer polysilicon nonvolatile memory structure of claim 10, wherein each of the group structures in the group array is identical.

12. The single-layer polysilicon nonvolatile memory structure according to claim 11, wherein each of the group structures further comprises a contact to the active region between the four storage transistors, wherein the shared line is connected to the contact.

13. The single-layer polysilicon nonvolatile memory structure according to claim 12, wherein the single-layer polysilicon nonvolatile memory structure is a one-time programmable memory.

14. The single-layer polysilicon nonvolatile memory structure according to claim 11, wherein the single-layer polysilicon nonvolatile memory structure is a one-time programmable memory.

15. A method of programming a single-layer polysilicon nonvolatile memory cell structure, the memory cell structure comprising a selection transistor and one storage transistor, both of which are in one substrate, and a capacitor, wherein the selection transistor comprises a selection gate, a gate oxide, a source electrode and a drain electrode under the selection gate, the storage transistor comprises a floating gate, a gate oxide, a source electrode and a drain electrode under the floating gate, the selection transistor is connected in series with the storage transistor, and the selection transistor and the storage transistor are mutually perpendicular to each other on the substrate, the capacitor and the selection transistor are on opposite sides of the storage transistor, and the floating gate and the gate oxide of the storage transistor are distal from one end of the selection transistor, extend in a direction perpendicular to and away from the selection transistor, and cover part of the substrate to form the capacitor, the method comprising:

driving the drain electrode of the selection transistor to a programming voltage; and driving the selection gate of the selection transistor, the source electrode of the storage transistor, and the substrate to a voltage rail opposite from the programming voltage.

16. The method according to claim 15, wherein the selection transistor and the storage transistor are both PMOS transistors, the programming voltage is 7-8 V, and the voltage rail opposite from the programming voltage is 0 V.

17. A single-layer polysilicon nonvolatile memory cell structure, comprising a selection transistor and one storage transistor, both of which are in one substrate, wherein the selection transistor comprises a selection gate, a gate oxide, a source electrode and a drain electrode under the selection gate; the storage transistor comprises a floating gate, a gate oxide, a source electrode and a drain electrode under the floating gate; the selection transistor is connected in series with the storage transistor, and the selection transistor and the storage transistor are mutually perpendicular to each other on the substrate; the storage transistor includes a first active region containing the source and drain electrodes of the storage transistor, the selection transistor includes a second active region containing the source and drain electrodes of the selection transistor, the selection gate of the selection transistor is perpendicular to the floating gate of the storage transistor, and the first active region is perpendicular to the second active region.

18. The single-layer polysilicon nonvolatile storage unit structure according to claim 17, further comprising a capacitor, wherein the capacitor and the selection transistor are on opposite sides of the storage transistor, and the floating gate and the gate oxide of the storage transistor are distal from one end of the selection transistor, extend in a direction perpendicular to and away from the selection transistor, and cover part of the substrate to form the capacitor.

19. The single-layer polysilicon nonvolatile storage unit structure according to claim 18, wherein the selection transistor and the storage transistor are both either PMOS transistors or both are NMOS transistors.

20. The single-layer polysilicon nonvolatile memory cell structure according to claim 18, wherein the single-layer polysilicon nonvolatile memory cell structure is a one-time programmable memory cell.

* * * * *